United States Patent [19]

Woodward

[11] 4,166,962
[45] Sep. 4, 1979

[54] CURRENT MODE D/A CONVERTER

[75] Inventor: James G. Woodward, Natick, Mass.

[73] Assignee: Data General Corporation, Southboro, Mass.

[21] Appl. No.: 828,429

[22] Filed: Aug. 26, 1977

[51] Int. Cl.$^2$ .................. H03K 5/08; G06G 7/12
[52] U.S. Cl. .................. 307/237; 307/229; 307/261
[58] Field of Search .............. 307/237, 260, 261, 229

[56] References Cited

U.S. PATENT DOCUMENTS

| | | | |
|---|---|---|---|
| 3,247,397 | 4/1966 | Kopek et al. | 307/229 |
| 3,475,601 | 10/1969 | Port | 307/229 X |
| 3,493,784 | 2/1970 | Brolin | 307/260 |
| 3,504,267 | 3/1970 | James et al. | 307/229 X |
| 3,544,812 | 12/1970 | Riso | 307/229 |
| 3,648,071 | 3/1972 | Mrazek | 307/229 X |
| 3,866,065 | 2/1975 | McIngvale | 307/260 |
| 3,989,961 | 11/1976 | Masreliez | 307/261 |

OTHER PUBLICATIONS

Gasbarro, "A/DC-Powered Frequency-to-Current Converter"; *Instruments and Control Systems* (pub.); pp. 46-47, 8/1971.

*Primary Examiner*—Larry N. Anagnos
*Attorney, Agent, or Firm*—Donald Brown

[57] ABSTRACT

Current mode D/A converter which accepts a word of binary code information and converts it into a current flowing into the output of the circuit which is directly proportional to the magnitude of the input code. In the preferred embodiment an operational amplifier is combined with an FET/BiPOLAR stage.

11 Claims, 1 Drawing Figure

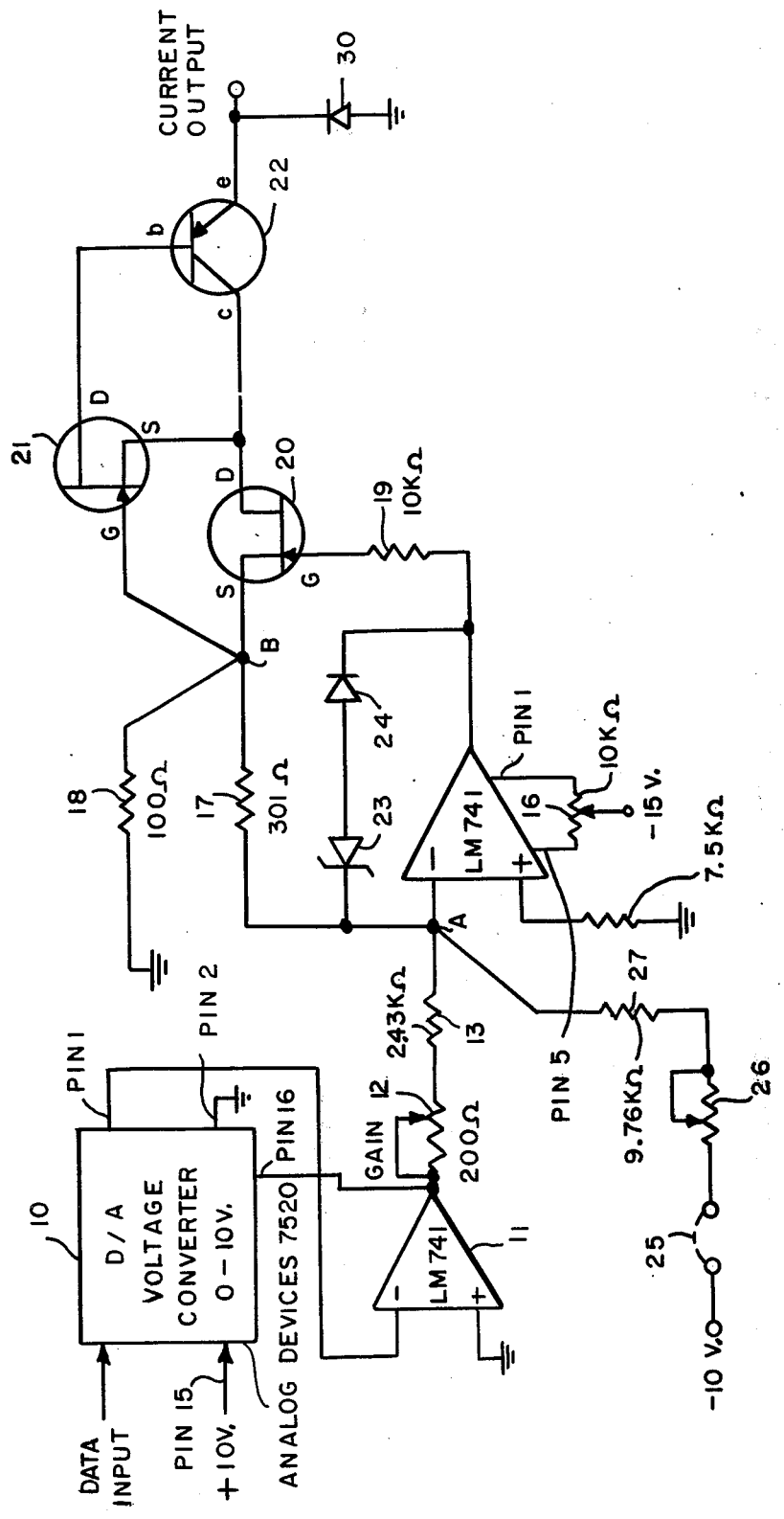

CURRENT MODE D/A CONVERTER

BACKGROUND OF THE DISCLOSURE

This disclosure is directed to a digital to analog (D/A) converter with current mode output. The device of this disclosure will accept a binary word and convert it to a current flowing into the output of the device. The magnitude of the current will be directly proportional to the magnitude of the input code.

In the past D/A converter circuits operating on the current mode would accept a binary word and first convert it into a voltage. This voltage would then normally be applied to an operational amplifier whose output would then be used to control the conduction of a transistor so that current is allowed to flow from a load through the transistor and into a resistor creating an IR drop. The voltage developed would then be compared with the input voltage with the circuit stabilizing when the voltages were zero.

While the prior art D/A converter circuits work well for non-zero values of current, they exhibit shortcomings at very low current levels. The present disclosure overcomes the problem of near zero current operation while also preferably including a current multiplying feature and allowing the use of simple low cost components.

BRIEF DESCRIPTION OF THE DRAWING

The sole FIGURE illustrates in block and circuit diagram form the preferred embodiment of the invention.

BRIEF SUMMARY OF THE DISCLOSURE

A digital to analog (D/A) converter with current mode output. The converter will accept an input of binarily coded information and convert it into a current flowing into the output of the circuit. The circuit of the disclosure overcomes near zero current operation difficulties while at the same time incorporating current multiplication and allowing the use of simple, low-cost components.

The aforementioned is accomplished in the preferred embodiment by using a low cost low power field effect transistor (FET) which is combined with a variable resistance so that the resistance will dissipate most of the power and the FET will act only as a low leakage current valve.

This function is preferably carried out in this invention by the combination of a low cost bipolar transistor and another field effect transistor. This combination as utilized acts to limit the voltage across the source and drain of said first mentioned field effect transistor to the pinch off voltage of the field effect transistor of the combination.

Current multiplication is also provided by a pair of resistors connected together at the source junction of the first mentioned FET.

DETAILED DESCRIPTION OF THE DISCLOSURE

Reference should now be had to the FIG. for a detailed description of the disclosure. The input stage of the circuit incorporates a reference voltage +10 V coupled to a monolithic D/A converter 10, e.g. Analog Devices No. 7520. The converter 10 is in turn connected to an operational amplifier 11, e.g., a National Semiconductor LM 741.

The output of the operational amplifier is approximately 0 to −9.9988 V from an input word of ten binary bits. This voltage is applied to the series combination of a resistor 12 and a resistor 13 which connect to the summing junction A of an operation amplifier 14, e.g. and LM 741. The overall configuration of the operational amplifier is that of an inverter, thus a negative voltage applied to resistors 12 and 13 will result in a positive current being extracted from the summing junction A (− input) of the operational amplifier 14. In response to this, the output of the operational amplifier will swing positive as it attempts to supply a positive current to the summing junction which is equal to the current extracted from that point.

As a result of the above, the operational amplifier 14 applies a positive voltage to the gate input of a controlled N-channel field effect transistor 20 through an input resistor 19.

The source of the transistor 20 is coupled to the junction B of resistors 17 and 18 and the summing junction A of the operational amplifier 14 is coupled to the opposite end of feedback resistor 17. The output of operational amplifier 14 will stabilize when the junction of feedback resistor 17 (301 ohms) and shunt resistor 18 (100 ohms) is driven to such a voltage that the current through the resistor 17 equals the current leaving the operational amplifier 14 summing junction A.

The above elements of the circuit provide the initial voltage to current conversion and multiplication. In particular current multiplication occurs because of the ratio of resistors 17 and 18 because they are driven to a common voltage by the operational amplifier 14 and FET 20 combination. Thus for example, if 4 MA. extracted from the summing junction A by -10 volts applied to approximately 2.5 K ohms, is multiplied by the ratio of resistors 17/18 (301/100=3.1), 12 MA. flows through the 100 ohm resistor 18 and the total current extracted is 4 MA.+12MA.=16MA.

Since one of the main features of this invention is to use a low cost low power FET 20, e.g., a 2N 4392 a variable resistance means is installed between FET 20 and any external load so that the variable resistance would dissipate most of the power and the FET 20 act only as a low leakage current valve.

In this invention this variable resistance function is carried out by the combination of a low cost PNP bipolar transistor 22 ce.g., a 2N 4033)and an N-channel field effect transistor 21 ce.g., a 2N .4393). As the FET 20 is turned on by the operational amplifier 14, current will flow from the external load through the forward biased base-emitter junction of transistor 22. This base-emitter current will flow through FET 21 into the drain of FET 20 turning on bipolar transistor 22.

The collector voltage of the bipolar transistor 22 will begin to swing positive as the bipolar transistor 22 moves toward saturation. However, when the source to drain voltage of FET 20 equals the pinch-off voltage of the FET 21, a negative feedback loop is created thereby turning off the FET 21.

Turning off of the FET 21 will then turn off the bipolar transistor 22. Thus the circuit stabilizes at a point where the voltage across the FET 20 will never exceed the pinch-off voltage of the FET 21.

Back to back diodes 23 and 24 are provided to insure that the negative voltage applied to FET 20 does not exceed −6V in order to keep the gate reverse breakdown voltage within 40 v. maximum when operated with a supply voltage less than 34 v.

A 10 K ohm potentiometer 16 is used to adjust the opamp 14 offset voltage so that the current output will be linear down to 0 amps in the 0 to 16 MA. range. The 200 ohm potentiator 12 is used to trim the full scale current.

At 25 there is shown a jumper which when connected converts the circuit to an adder configuration. The value of resistors 26 and 27 and −10 v causes a current of 4 MA. to flow at all times into the output. However the current into the summing junction is 1 MA. which is then multiplied to provide a quiescent current of 4 MA. To this 4 MA. will be added the current called for by the input data. Thus the output range of the circuit will be 4–20 MA.

The multiplication provided by resistors 17 and 18 may be changed by changing their values, however the maximum current should always be less than the zero gate voltage drain current of the FET 20. While the circuit provides negative current it is well within the skill of the art to use a bipolar NPN transistor and P channel FET's and make the obvious circuit changes to provide positive output currents.

As an alternative to the input structure comprising D/A 10, OP - AMP - 11 and resistors 12 and 13, a current mode D/A converter such as an Analog Device No. 562 may be used. In this event, a current would be extracted directly from the summing junction A by the D/A converter which would subsequently be multiplied by the resistor ratio (17 and 18) in the feedback loop.

Thus the invention provides a converter not having the inaccuracies which would be present if a bipolar transistor were used since low cost bipolar transistors conventionally have collector leakage currents which can easily reach values of tens of microamperes over a 0 to 55° C. operating range.

For example, in a converter employing bipolar transistors and designed to deliver 0–16 MA., the value of one least significant bit (LSB) is 1/1024 of range or 16 microamperes. As the differential non-linearity of the D/A is specified at +/−½ LSB, this would indicate the value of the output current must be true to a value of +/− only 8 microamperes. Bipolar transistors could easily exceed this figure in leakage current thus destroying the accuracy of the D/A circuit.

This invention also provides cost advantages over a converter circuit using a low leakage current high power expensive FET. With the present circuit, a low cost low power FET 20 is usable since the power is being dissipated by other low cost elements 21 and 22.

The FET 21 and bipolar 22 combination may be viewed as a single three terminal device behaving as an N - channel FET with a high current and power rating at low component cost. This combination in effect limits the voltage across FET 20 to no more than the pinch off voltage of FET 21 e.g., 3.0 V maximum and thus the power dissipated by FET 20 is limited to the current flowing therethrough multiplied by the 3.0 V. For example if the current maximum is 20 MA., with the jumper 25 connected, then the power dissipated by FET 20 would be 60 MW. This is a conservative rating well within the range of a low cost FET.

The construction shown for the FET 20 and 21 and bipolar transistor 22 is well suited to being formed as a single integrated circuit chip.

A diode 30, e.g., a 1N 4001, is coupled between the output and ground to limit negative voltages to 0.6 V to prevent damage to the output circuit.

I claim:

1. A device comprising a controlled field effect transistor having source and drain terminals, and means coupled between said field effect transistor source and drain terminals for limiting the voltage across said source and drain terminals of said field effect transistor to a predetermined voltage which cuts off current flow in said means in order to limit the power dissipated by said field field effect transistor.

2. The converter of claim 1 in which said means comprises means exhibiting a variable resistance.

3. The converter of claim 1 in which said means comprises a bipolar transistor and field effect transistor, said bipolar transistor coupled to said field effect transistor of said means to limit the voltage across the source and drain of said controlled field effect transistor to no more than the pinch off voltage of said field effect transistor of said means.

4. A device comprising a controlled field effect transistor having source and drain terminals, and means coupled between said field effect transistor source and drain terminals for limiting the voltage across said source and drain terminals of said field effect transistor in order to limit the power dissipated by the field effect transistor, said means comprises another field effect transistor having gate, source and drain terminals and a bipolar transistor having collector, base, and emitter terminals, the emitter of the bipolar transistor coupled to the output terminal of the converter, the base of the bipolar transistor coupled to the drain of said another field effect transistor, the gate of said another field effect transistor coupled to the source of said controlled field effect transistor and the source of said another field effect transistor coupled to the drain of said controlled field effect transistor and the collector of said bipolar transistor.

5. A device comprising a first field effect transistor, a second field effect transistor coupled to said first field effect transistor, and a bipolar transistor, coupled to said first field effect transistor to limit the voltage across the source and the drain of said first field effect transistor to no more than the pinch off voltage of said second field effect transistor, the source of said first field transistor is coupled to the gate of said second field effect transistor, the drain of said first field effect transistor is coupled to the source of said second field effect transistor, the collector of said bipolar transistor is coupled to the drain of said first field effect transistor and the source of said second field effect transistor, and the base of said bipolar transistor coupled to the drain of said second field effect transistor.

6. A current mode D/A converter comprising an operational amplifier having a summing input, a loop coupled between the summing input of the operational amplifier and the output of the operational amplifier, the loop having a feedback resistor coupled in series to the source of an FET and a shunt resistor coupled to the connection of the FET source and the feedback resistor of the loop for providing current multiplication.

7. The converter according to claim 6 in which said FET has a variable resistance comprising an additional FET and bipolar transistor for limiting the voltage across the FET source to drain to a value of less than the pinch off voltage of the FET of the variable resistance.

8. The converter according to claim 6 including means coupled to the summing input for adding a fixed current.

9. The converter according to claim 7 including means coupled to the summing input for adding a fixed current.

10. A system for providing a controlled current to a load comprising a D/A converter, a current amplifier coupled to the output of said D/A converter and including a first field effect transistor having across its source and drain terminals means for limiting the voltage across the source and drain terminals of the first field effect transistor to limit the power dissipated by it, said means comprises a second field effect transistor with its gate coupled to said source and its source coupled to said drain and a bipolar transistor whose collector is coupled to the drain of said first field effect transistor and the source of said second field effect transistor, whose base is coupled to the drain of said second field effect transistor and whose emitter is coupled to the load.

11. The system of claim 10 in which the current amplifier also includes an operational amplifier coupled between said first field effect transistor and the output of said D/A converter, and current shunt means coupled to the source of said first field effect transistor for amplifying the input current to the operational amplifier provided by the D/A converter.

* * * * *